(12) United States Patent
Liu et al.

(10) Patent No.: US 12,153,350 B2
(45) Date of Patent: *Nov. 26, 2024

(54) METHOD OF MANUFACTURING SEMICONDUCTOR DEVICES

(71) Applicant: TAIWAN SEMICONDUCTOR MANUFACTURING COMPANY, LTD., Hsinchu (TW)

(72) Inventors: Ru-Gun Liu, Hsinchu (TW); Huicheng Chang, Hsinchu (TW); Chia-Cheng Chen, Hsinchu (TW); Jyu-Horng Shieh, Hsinchu (TW); Liang-Yin Chen, Hsinchu (TW); Shu-Huei Suen, Hsinchu (TW); Wei-Liang Lin, Hsinchu (TW); Ya Hui Chang, Hsinchu (TW); Yi-Nien Su, Hsinchu (TW); Yung-Sung Yen, Hsinchu (TW); Chia-Fong Chang, Hsinchu (TW); Ya-Wen Yeh, Hsinchu (TW); Yu-Tien Shen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,993

(22) Filed: Jul. 19, 2023

(65) Prior Publication Data
US 2024/0019787 A1    Jan. 18, 2024

Related U.S. Application Data

(63) Continuation of application No. 16/587,710, filed on Sep. 30, 2019, now Pat. No. 11,796,922.

(51) Int. Cl.
*G03F 7/00*   (2006.01)
*G03F 1/22*   (2012.01)
(Continued)

(52) U.S. Cl.
CPC ............ *G03F 7/70558* (2013.01); *G03F 1/22* (2013.01); *G03F 1/36* (2013.01); *G03F 1/70* (2013.01);
(Continued)

(58) Field of Classification Search
None
See application file for complete search history.

(56) References Cited

U.S. PATENT DOCUMENTS

| 5,313,419 A | 5/1994 | Chang |
| 5,316,640 A | 5/1994 | Wakabayashi et al. |

(Continued)

FOREIGN PATENT DOCUMENTS

| JP | 55-029188 A | 3/1980 |
| JP | S61-255663 A | 11/1986 |

(Continued)

OTHER PUBLICATIONS

Non-Final Office Action issued in U.S. Appl. No. 16/587,710, dated Mar. 15, 2022.
(Continued)

*Primary Examiner* — Martin J Angebranndt
(74) *Attorney, Agent, or Firm* — STUDEBAKER & BRACKETT PC

(57) ABSTRACT

In a method of forming a pattern, a photo resist layer is formed over an underlying layer, the photo resist layer is exposed to an actinic radiation carrying pattern information, the exposed photo resist layer is developed to form a developed resist pattern, a directional etching operation is applied to the developed resist pattern to form a trimmed resist pattern, and the underlying layer is patterned using the trimmed resist pattern as an etching mask.

20 Claims, 12 Drawing Sheets

(51) Int. Cl.
  *G03F 1/36* (2012.01)
  *G03F 1/70* (2012.01)
  *G03F 7/40* (2006.01)
  *H01L 21/027* (2006.01)

(52) U.S. Cl.
  CPC .............. *G03F 7/0035* (2013.01); *G03F 7/40* (2013.01); *G03F 7/70033* (2013.01); *G03F 7/70625* (2013.01); *H01L 21/0274* (2013.01)

(56) References Cited

U.S. PATENT DOCUMENTS

| | | |
|---|---|---|
| 9,905,754 B1 | 2/2018 | Yoon et al. |
| 10,276,372 B2 | 4/2019 | Shih et al. |
| 10,658,184 B2 | 5/2020 | Shen et al. |
| 10,790,155 B2 | 9/2020 | Liu et al. |
| 10,861,698 B2 | 12/2020 | Shen et al. |
| 10,867,840 B2 | 12/2020 | Su et al. |
| 11,004,729 B2 | 5/2021 | Liu et al. |
| 11,094,556 B2 | 8/2021 | Yeh et al. |
| 11,322,362 B2 | 5/2022 | Hsiao et al. |
| 11,342,193 B2 | 5/2022 | Liu et al. |
| 11,796,922 B2 * | 10/2023 | Liu .................. G03F 7/70558 |
| 2003/0148224 A1 | 8/2003 | Vahedi et al. |
| 2005/0130072 A1 | 6/2005 | Koeda |
| 2011/0233546 A1 | 9/2011 | Higashi et al. |
| 2014/0370708 A1 * | 12/2014 | Wu .................. H01L 21/0273 438/712 |
| 2015/0132965 A1 | 5/2015 | deVilliers et al. |
| 2015/0234272 A1 | 8/2015 | Sarma et al. |
| 2015/0311073 A1 | 10/2015 | Srinivasan et al. |
| 2016/0013030 A1 | 1/2016 | Venugopal et al. |
| 2016/0379824 A1 | 12/2016 | Wise et al. |
| 2017/0042010 A1 | 2/2017 | Liang et al. |
| 2018/0082844 A1 | 3/2018 | Sherman et al. |
| 2018/0174853 A1 | 6/2018 | Shen et al. |
| 2018/0204719 A1 | 7/2018 | Ma et al. |
| 2019/0148145 A1 | 5/2019 | Huang et al. |
| 2019/0267246 A1 | 8/2019 | Bai et al. |
| 2020/0006085 A1 | 1/2020 | Yeh et al. |
| 2020/0105585 A1 * | 4/2020 | Su .................. H01L 21/02282 |
| 2020/0144061 A1 | 5/2020 | Mignot et al. |
| 2020/0272050 A1 | 8/2020 | Robinson et al. |

FOREIGN PATENT DOCUMENTS

| | | |
|---|---|---|
| JP | 02-186346 A | 7/1990 |
| JP | 02-253615 A | 10/1990 |
| JP | 03-235311 A | 10/1991 |
| JP | 04-323388 A | 11/1992 |
| JP | 2002-359227 A | 12/2002 |
| JP | 2004-006738 A | 1/2004 |
| JP | 2004-219928 A | 8/2004 |
| TW | 201824342 A | 7/2018 |

OTHER PUBLICATIONS

Final Office Action issued in U.S. Appl. No. 16/587,710, dated Jun. 28, 2022.
Non-Final Office Action issued in U.S. Appl. No. 16/587,710, dated Nov. 16, 2022.
Final Office Action issued in U.S. Appl. No. 16/587,710, dated Mar. 1, 2023.
Notice of Allowance issued in U.S. Appl. No. 16/587,710, dated Jun. 15, 2023.

* cited by examiner

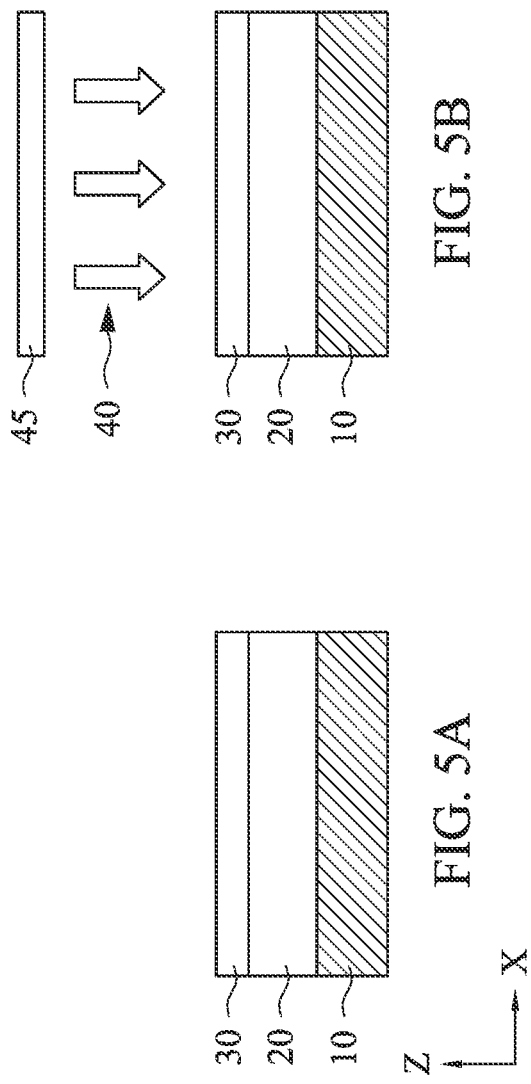
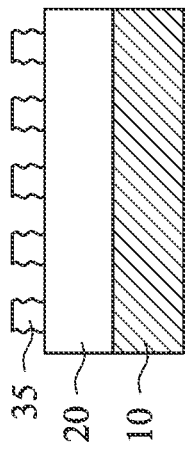
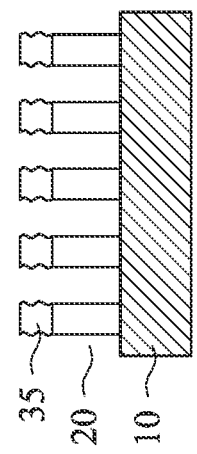
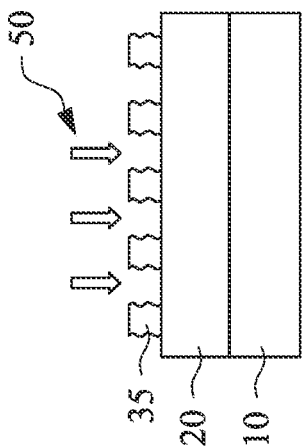

METHOD OF MANUFACTURING SEMICONDUCTOR DEVICES

RELATED APPLICATIONS

This application is a continuation of U.S. patent application Ser. No. 16/587,710 filed Sep. 30, 2019, now U.S. Pat. No. 11,796,922, issued Oct. 24, 2023, the entire content of which is incorporated herein by reference.

BACKGROUND

At semiconductor technology nodes of 7 nm or smaller, line-and-space (L/S) patterning requires pitch resolution in optical lithography smaller than about 32 nm. In general, even if extreme ultra violet (EUV) lithography is employed, the resolution limitation by EUV single-exposure technology (SPT) is about 28 nm to about 34 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A, 5B, 5C, 5D, 5E and 5F illustrate a sequential operation of a pattern formation method according to an embodiment of the present disclosure.

DETAILED DESCRIPTION

Figure 1B:
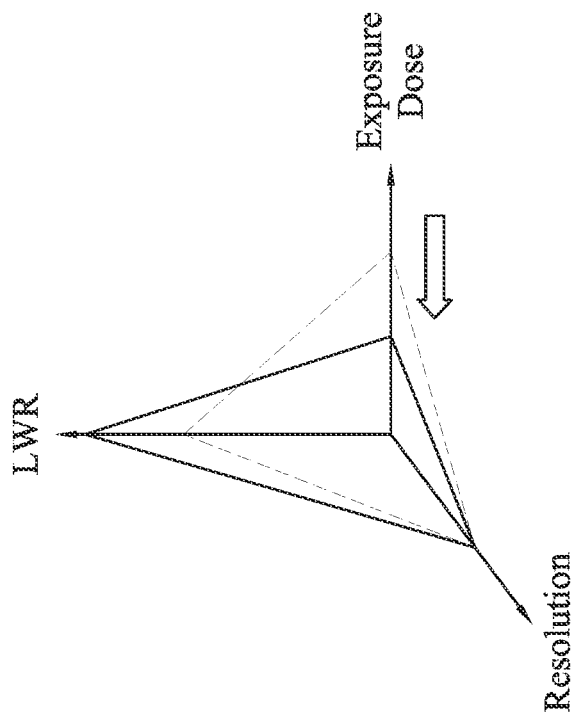
FIGS. 1A and 1B illustrate relationship among pattern resolution, line width roughness (LWR) and an exposure dose.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure. In the present disclosure, a directional patterning technique using a high-sensitivity (low dose) lithography technology will be explained.

EUV lithography can form nano-meter order patterns smaller than, e.g., about 32 nm, but requires a very expensive EUV lithography apparatus. Accordingly, improving productivity (throughput e.g., the number of semiconductor wafers processed per hour) of an EUV lithography operation is one of the key issues to reduce a manufacturing cost of a semiconductor device.

There are several ways to improve productivity of an EUV lithography operation. For example, decreasing a required dose amount per exposure of an EUV exposure light can improve the throughput of the EUV lithography operation. The required dose amount per exposure of an EUV exposure can be reduced by, for example, increasing a sensitivity of an EUV photo resist. The sensitivity of an EUV photo resist can generally be increased by optimizing the composition of the EUV photo resist by itself in some embodiments. The sensitivity of an EUV photo resist can also be increased (or the required dose amount can be reduced) by optimizing a post exposure baking (PEB) temperature (e.g., increasing the PEB temperature) performed after the exposure to the EUV light and before development of the exposed EUV photo resist in some embodiments, and by reducing a thickness of the EUV photo resist in other embodiments. In other embodiments, the required dose amount can be reduced by adjusting a mask bias amount of an EUV photo mask. At the same time, the EUV lithography operation requires a desired pattern resolution (minimum pattern dimension patternable by an EUV lithography operation).

Figure 1A:
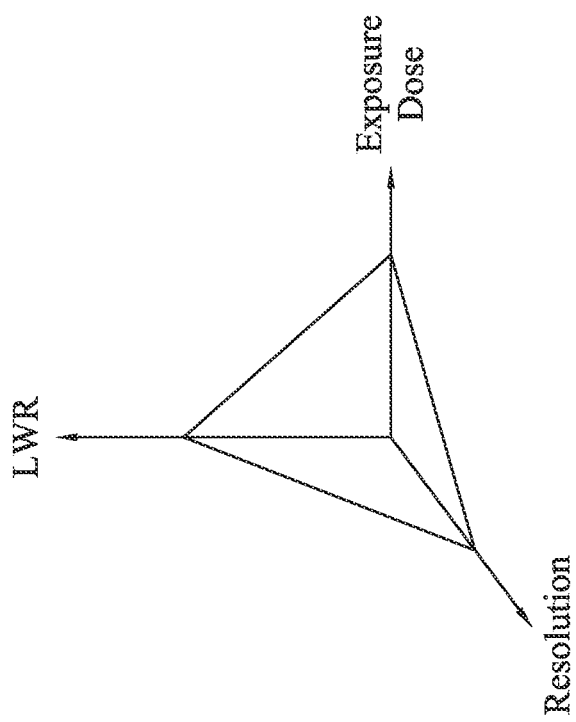

When the sensitivity of the EUV photo resist is increased, however, a quality of the developed EUV photo resist may degrade. For example, a line pattern may have a rough side surface, i.e., a higher line width roughness. FIGS. 1A and 1B show the relationship among the pattern resolution, the line width roughness (LWR) and the exposure dose. As set forth above, when the required dose amount for an EUV photo resist is decreased (the sensitivity is increased), while maintaining the pattern resolution, the line width roughness generally increases. Similarly, improving the resolution (smaller patterns) would result in an increase in the exposure dose and/or an increase in the line width roughness.

A directional patterning technique includes a directional etching technique and a directional deposition technique. The directional etching can be characterized as horizontal or surface anisotropic or selective etching, in which a target layer or pattern is etched substantially in only one direction (e.g., X direction) within a plane (X-Y plane) parallel to a substrate, substantially without etching another direction (e.g., Y direction).

In the present disclosure, the line width roughness caused by a low dose EUV lithography is reduced by using a directional patterning technique.

Figure 2C:
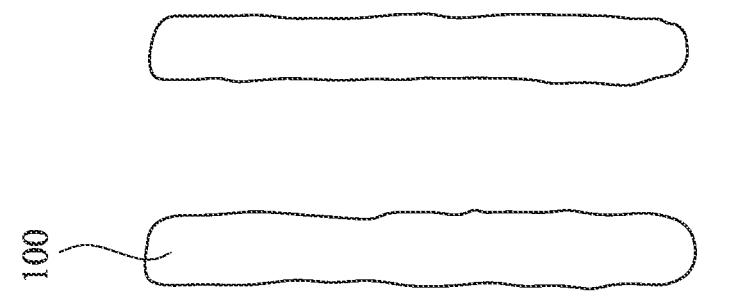
FIGS. 2A, 2B and 2C show a sequential operation of a pattern formation method according to an embodiment of the present disclosure.
Figure 2B:
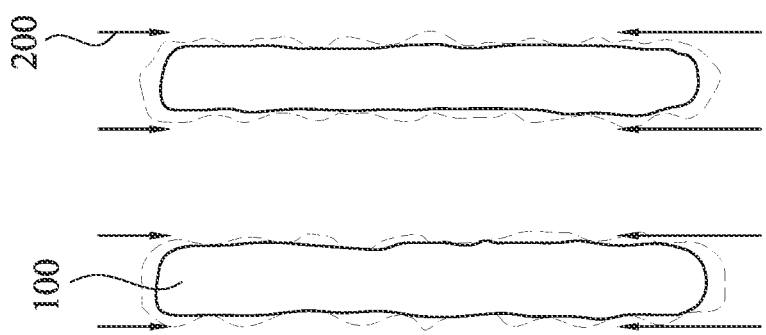
Figure 2A:
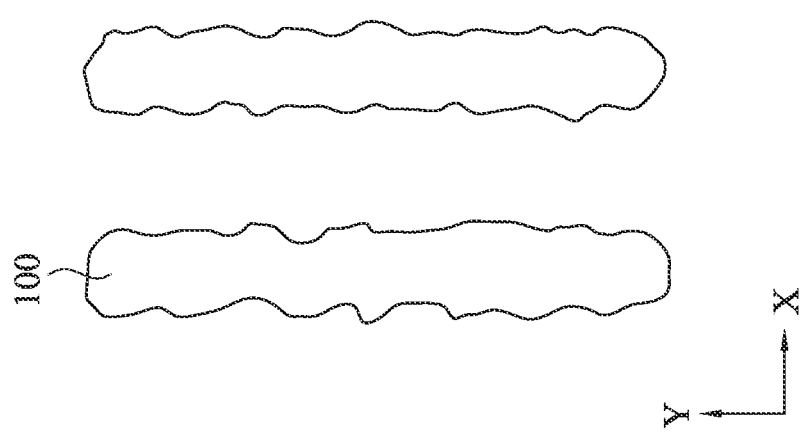

FIGS. 2A, 2B and 2C show a sequential operation of a pattern formation method according to an embodiment of the present disclosure.

FIG. 2A shows a EUV photo resist pattern 100 in plan view as developed. In some embodiments, the photo resist pattern 100 is a line and space pattern extending in the Y direction and arranged in the X direction, and the pattern width is about 30 nm and the pitch is about 30 nm. The number of the line patterns is not limited to 2 as shown in FIG. 2A. In some embodiments, a photo resist layer is exposed with a low dose amount in a range from 25 mJ/cm$^2$ to 55 mJ/cm$^2$. In other embodiments, the dose amount of the EUV light is in a range from 30 mJ/cm$^2$ to 45 mJ/cm$^2$.

As shown in FIG. 2A, the side faces of the as-developed photo resist pattern 100 have a rough surface. In some embodiments, the roughness of the side faces of the as-developed photo resist pattern 100 is in a range from about 3 nm to about 5 nm. The roughness of the side faces is calculated as 3σ (σ: standard deviation) of line width values. In some embodiments, about 10 to about 100 points (e.g., 50 points) along the Y direction of the pattern width along the X direction are measured by using a scanning electron microscope, and the 3σ value is calculated.

As shown in FIG. 2B, a directional etching operation 200 is performed along the Y direction to trim or smooth the side faces of the photo resist pattern 100.

After the directional etching operation 200, the roughness of the side faces of the photo resist pattern is reduced as shown in FIG. 2C. In some embodiments, the roughness of the side faces after the directional etching operation 200 is in a range from about 0.1 nm to about 3 nm.

Figure 2D:
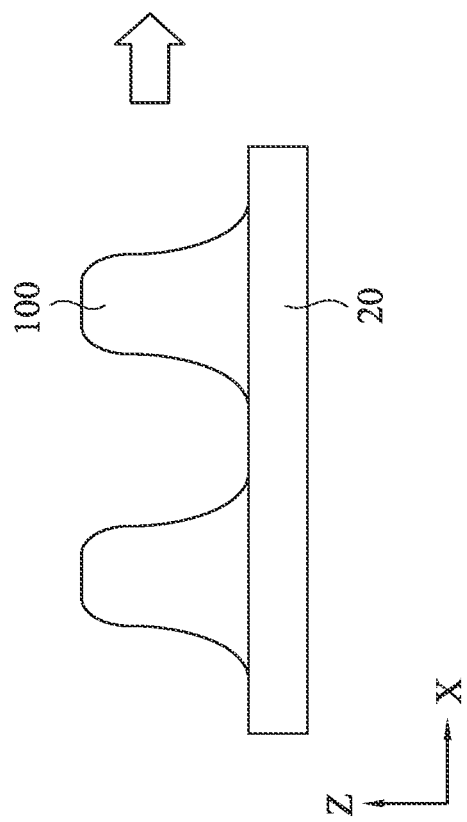
FIGS. 2D and 2E show a sequential operation of a pattern formation method according to another embodiment of the present disclosure.
Figure 2E:
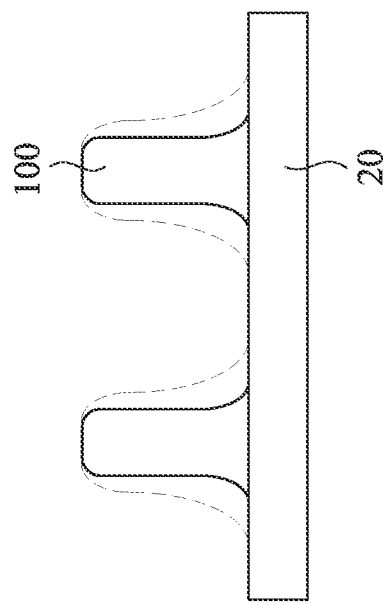

FIGS. 2D and 2E show a sequential operation of a pattern formation method according to another embodiment of the present disclosure.

In some embodiments, a resist pattern profile in the vertical direction (Z direction) is improved by a directional etching. FIG. 2D shows a cross sectional view of an as-developed photo resist pattern 100 formed on an underlying layer 20. As shown in FIG. 2D, in some embodiments, due to lithography conditions, the pattern profile of the photo resist pattern 100 has a tapered shaped. In some embodiments, the directional etching operation can to remove the tail portions of the tapered shaped, as shown in FIG. 2E.

A directional etching can be performed by tuning various etching parameters to generate etching species (free radicals) that travel in a substantially horizontal direction or that incident on the substrate with a large incident angle of more than about 10-30 degrees (where the angle of 90 degrees is horizontal). The etching parameters to be tuned include, but are not limited to, etchant (gas) composition, etching temperature, etching time, etching pressure, radio frequency (RF) bias voltage, RF bias power, etchant flow rate, wafer tilting, other suitable etching parameters, or combinations thereof.

Figure 3A:
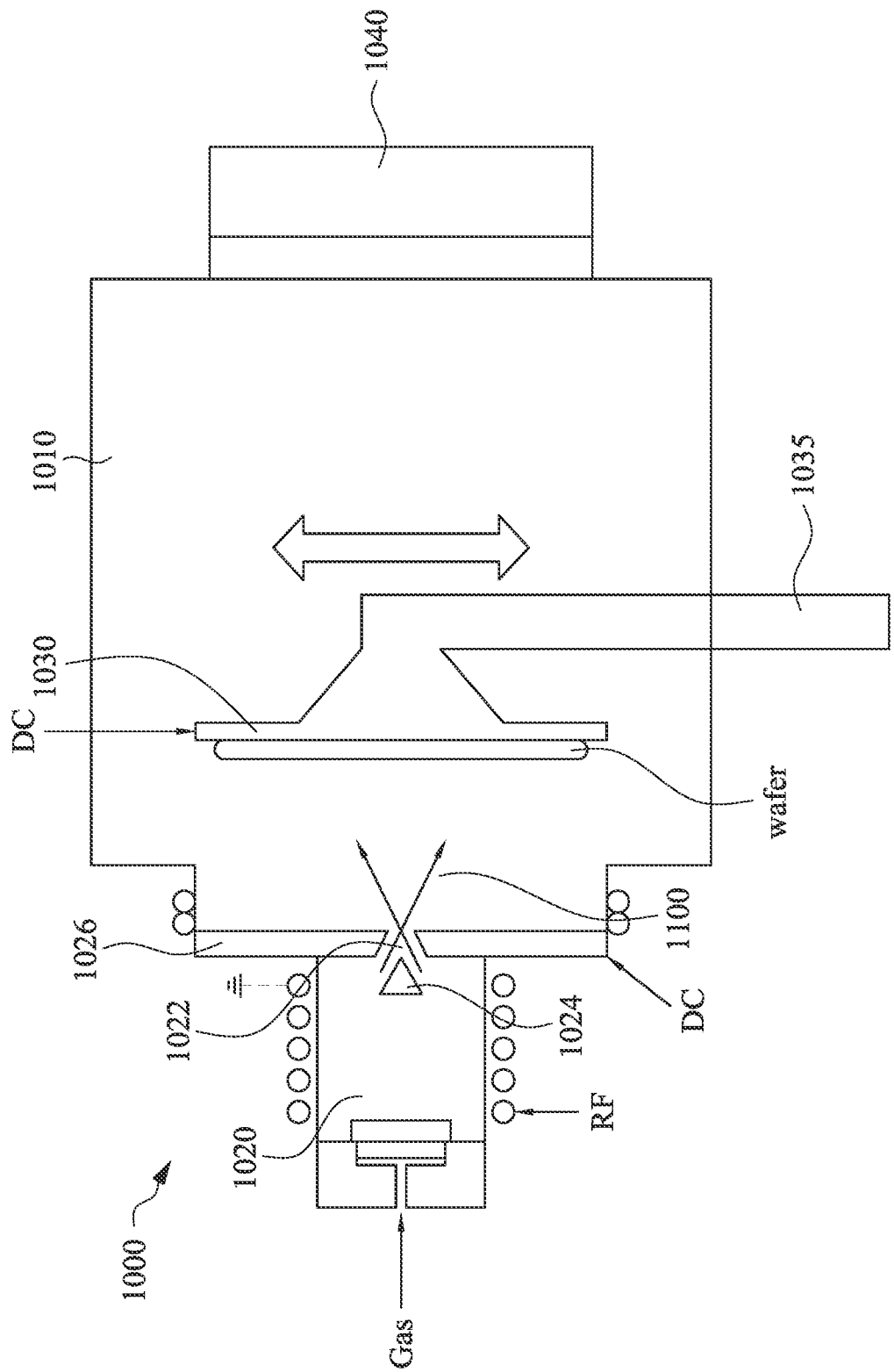
FIG. 3A shows a schematic view of a directional patterning apparatus in accordance with an embodiment of the present disclosure.
Figure 3C:
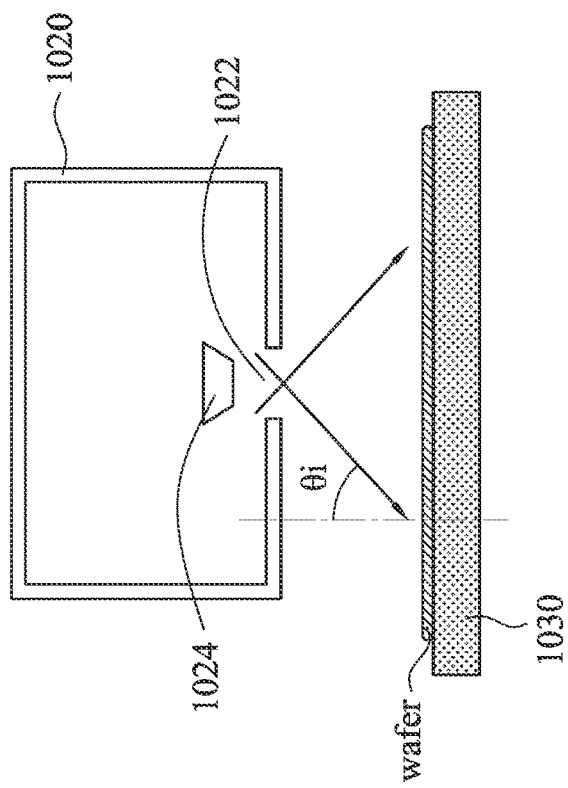
FIGS. 3B, 3C and 3D show schematic views of directional patterning in accordance with an embodiment of the present disclosure.
Figure 3B:
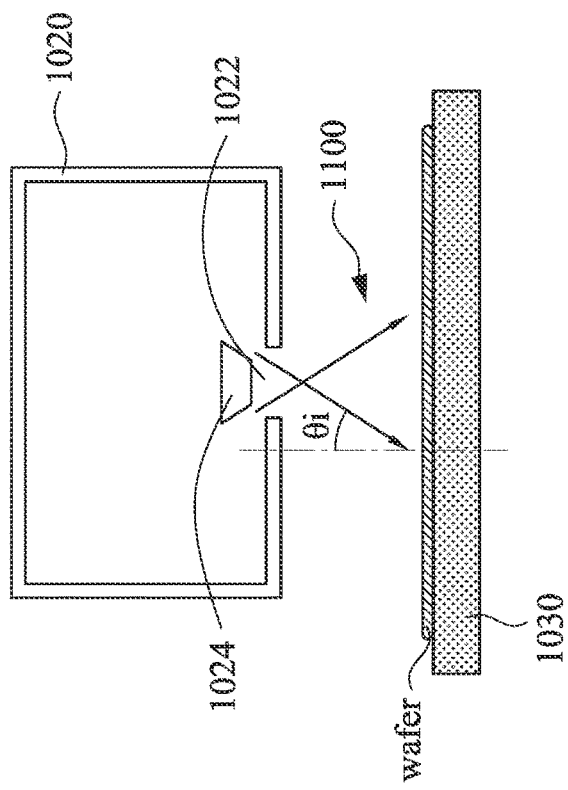
Figure 3D:
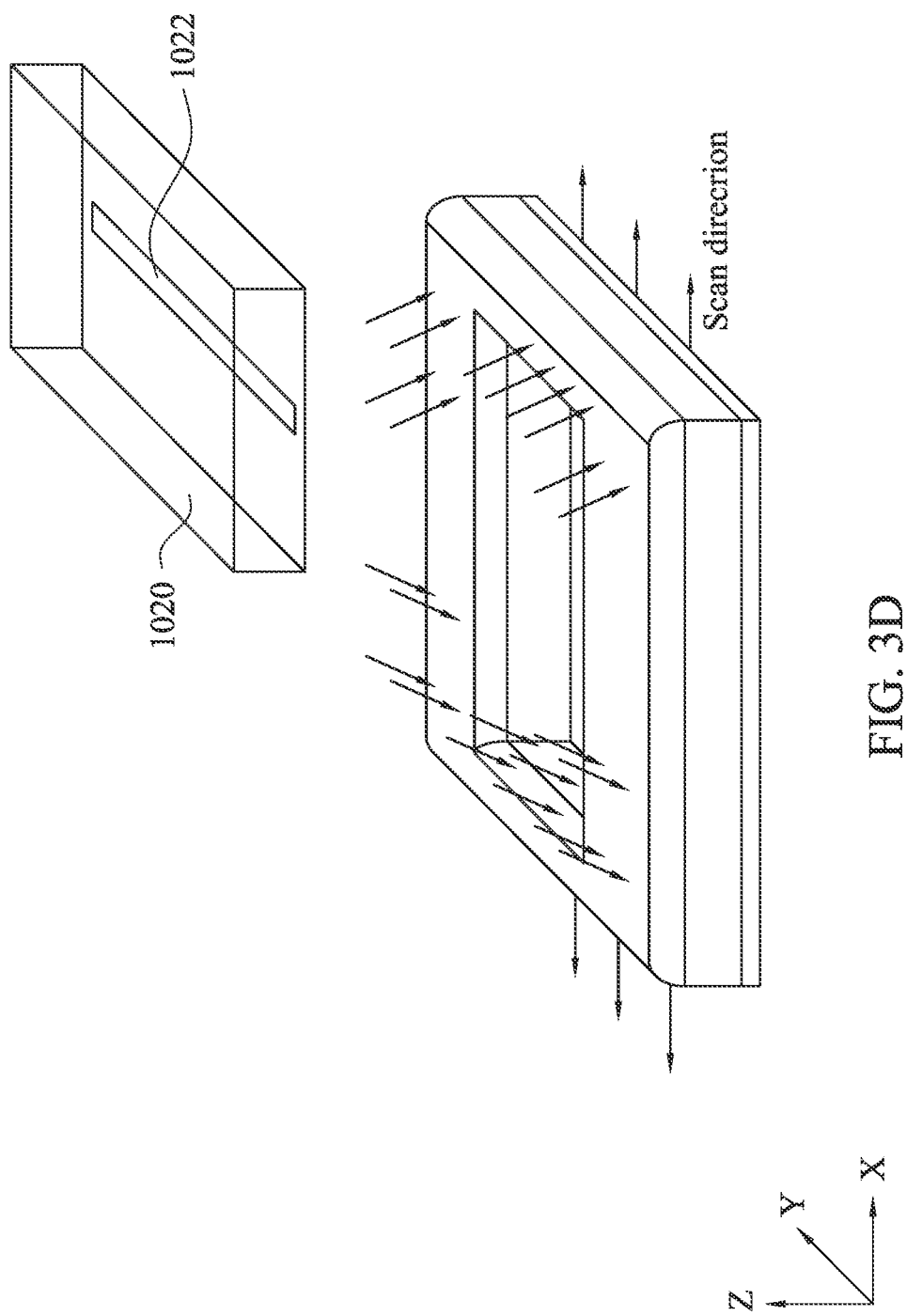

FIG. 3A shows a schematic view of a directional patterning apparatus, and FIGS. 3B, 3C and 3D show schematic views of directional patterning in accordance with an embodiment of the present disclosure.

As shown in FIG. 3A, the directional patterning apparatus, for example, a directional etching apparatus 1000 includes a main chamber 1010 in which a wafer stage 1030 for a wafer to be processed is disposed, and a plasma generation chamber 1020 for generating plasma. In some embodiments, the plasma is RF (radio frequency) generated plasma, using a high frequency power supply at 13.56 MHz and/or 2.45 GHz. Other frequency ranges may be used. A separation plate 1026 is disposed between the main chamber 1010 and the plasma chamber 1020. The separation plate 1026 includes a slit 1022 from which plasma beams 1100 are introduced into the main chamber. In some embodiments, an adjustable meniscus 1024 is provided over the slit 1022 in the plasma chamber side. One or more vacuum systems 1040 including, for example, a turbo molecular pump, is coupled to the main chamber and to the plasma chamber (not shown) to maintain reduced pressure states in the chambers. In some embodiments, during the etching process, the pressure in the main chamber is lower than the pressure in the plasma chamber. In certain embodiments, the pressure in the main chamber is in the order to $1\times10^{-5}$ Torr, and the pressure in the plasma chamber is in the order to $1\times10^{-3}$ Torr.

In some embodiments, the separation plate 1026 and the wafer stage 1030 are biased by DC voltage, respectively, to extract and control the plasma beams 1100. Further, the wafer stage 1030 is movable by a moving mechanism 1035 to scan the wafer relative to the plasma beams 1100.

In some embodiments, at least one of RF and DC bias voltages is tuned to achieve an electric field that causes etching species to flow substantially horizontally along an in-plane direction (for example, in the X direction) relative to a surface over the substrate, or to provide a large incident angle. In some embodiments, the etching species are tuned to have a profile of momenta of the energetic species such that the momenta of the etching species or energetic species along a frontline are not the same, i.e., the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species along the etching front.

In some embodiments, as shown in FIGS. 3B and 3C, a position of the meniscus 1024 is adjusted to change the incident angle θi of the plasma beams 1100. As shown in FIG. 3D, by scanning the wafer along the X direction, a groove pattern can be formed without substantially expanding the groove in the Y direction.

In some embodiments, a ratio of an amount of etching in the X direction to an amount of etching in the Y direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments. Further, an amount of etching along the Z direction (vertical direction) is smaller than the amount of etching in the X direction. In some embodiments, a ratio of an amount of etching in the X direction to an amount of etching in the Z direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments.

Figure 4:
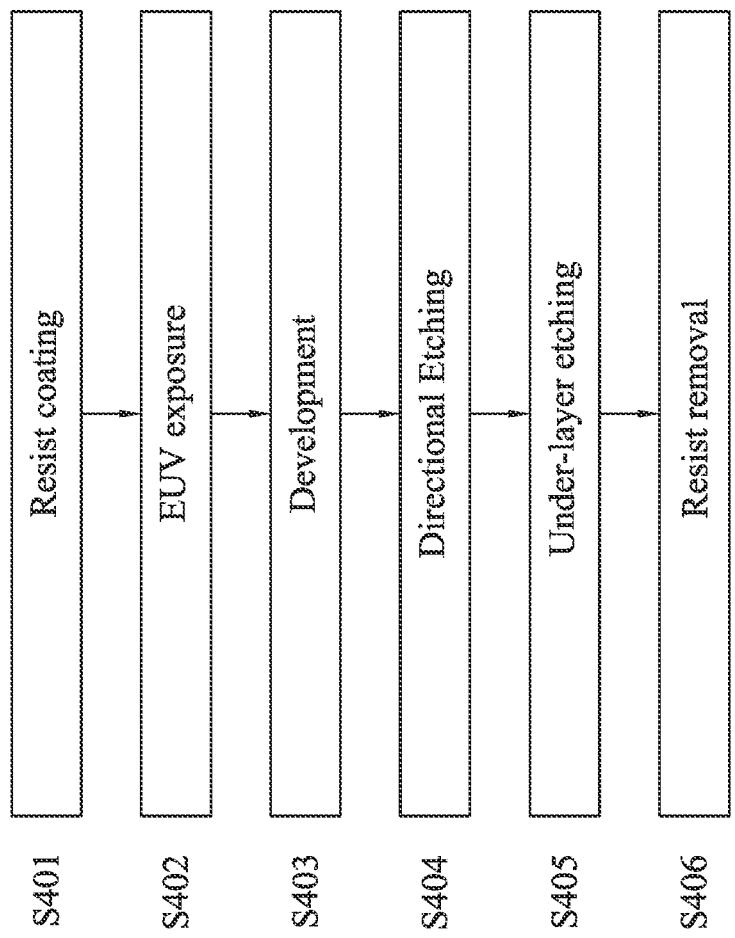
FIG. 4 illustrates a flow chart of a sequential operation of a pattern formation method according to an embodiment of the present disclosure.

FIG. 4 illustrates a flow chart of a sequential operation of a pattern formation method according to an embodiment of the present disclosure. FIGS. 5A, 5B, 5C, 5D, 5E and 5F illustrate a sequential operation of a pattern formation method according to an embodiment of the present disclosure. It is understood that additional operations can be provided before, during, and after the operations of FIG. 4 and FIGS. 5A-5F, and some of the operations described below can be replaced or eliminated, for additional embodiments of the method. The order of the operations/processes may be interchangeable.

As shown in FIG. 5A, at S401 of FIG. 4, a photo resist 30 is coated on an underlying layer 20 disposed over a substrate 10. In some embodiments, the substrate 10 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 100 may include an epitaxial layer (epi-layer), which may be strained for performance enhancement, and/or may include a silicon-on-insulator (SOI) structure. In one embodiment, a p-type silicon substrate is used.

The underlying layer 20 to be patterned is one or more layers of a conductive material and/or a dielectric material. In some embodiments, the underlying layer 20 includes a dielectric material, such as silicon oxide, silicon nitride, SiON, SiOC, SiOCN, SiCN, aluminum based dielectric material, low-k material, organic material, or any other dielectric material used in a semiconductor device fabrication. In one embodiment, a silicon oxide is used. In other embodiments, the underlying layer 20 is one or more conductive material layers, such as polysilicon and metallic materials. The metallic materials include W, Cu, Ti, Ta, Ag, Al, AlCu, TiAl, TiN, TaN, TiAlN, TiAlC, TaC, TaCN, TaSiN, Mo, Mn, Co, Pd, Ni, Re, Ir, Ru, Pt, and/or Zr, or alloys thereof (e.g., silicide), in some embodiments. The underlying layer 20 can be formed by physical vapor deposition (PVD), chemical vapor deposition (CVD), or atomic layer deposition (ALD), although any acceptable process may be utilized.

In some embodiments, the thickness of the photo resist layer 30 is in a range from about 50 nm to about 500 nm depending on various process conditions and/or resist properties. In some embodiments, the photo resist layer 30 is spin-coated on the underlying layer 30. In some embodiments, the photo resist layer 30 is an EUV photo resist or a DUV photo resist. In some embodiments, a bottom antireflective coating (BARC) layer is formed on the underlying layer 20 before coating the photo resist layer.

Then, as shown in FIG. 5B, at S402 of FIG. 4, the photo resist layer 30 is exposed with an actinic radiation 40 carrying pattern information of a circuit pattern formed on a photo mask 45. In some embodiments, before the exposure to the actinic radiation 40, the photo resist layer 30 is subjected to a pre-baking process. In some embodiments, the actinic radiation 40 is an EUV light (about 13.5 nm wavelength). In other embodiments, an electron beam, an ArF laser light or a KrF laser light can be used as the actinic radiation. The photo mask 45 is a reflective photo mask for an EUV light in some embodiments. In other embodiments the photo mask 45 is a transmissive photo mask for an ArF laser light or a KrF laser light. When an electron beam is used, no photo mask is used in some embodiments.

In some embodiments, a high sensitivity EUV photo resist is used as the photo resist layer 30. In some embodiments, a high sensitivity EUV photo resist requires a standard exposure dose amount of an EUV light in a range from about 60% to 90% of the standard exposure dose amount of an EUV light of a standard EUV photo resist. In some embodiments, a high sensitivity EUV photo resist requires a standard exposure dose amount of an EUV light in a range from about 25 mJ/cm$^2$ to about 55 mJ/cm$^2$. In other embodiments, the standard dose amount of the high sensitivity EUV photo resist is in a range from about 30 mJ/cm$^2$ to about 45 mJ/cm$^2$. In certain embodiments, the standard dose amount of the high sensitivity EUV photo resist is equal to or smaller than 40 mJ/cm$^2$ or 30 mJ/cm$^2$. In some embodiments, the standard dose amount is determined as a dose amount to obtain line-and-space patterns (e.g., 10 lines) having a line width of 15 nm and a pitch of 30 nm (and a length of 100 nm) over a substrate (e.g., Si substrate) with a 100 nm thickness photo resist coated on the substrate (no BARC layer) and with a photo mask having no mask bias. In some embodiments, the standard dose amount is the same as the required dose amount for patterning a specific circuit pattern. In other embodiments, the required dose amount is smaller or larger than the standard dose amount.

In some embodiments, the high sensitivity EUV photo resist includes a polymer resin, a photoactive compound (PAC) and a solvent. In some embodiments, the high sensitivity EUV photo resist further includes an organometallic compound and/or an enhancement additive. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs. In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like. In some embodiments, the sensitivity of an EUV photo resist is adjusted to the aforementioned range by adjusting an amount (concentration) of the PAC, selecting a specific type of PAC and/or increasing the number of photo active units coupled to the base structure.

In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

After the exposure, the exposed photo resist layer 30 is subjected to a post exposure baking (PEB) process and then to a developing process, thereby forming a developed photo resist pattern 35 at S403 of FIG. 4, as shown in FIG. 5C. In some embodiments, the temperature of the PEB process is in a range from about 100° C. to about 180° C., and is in a range from about 120° C. to about 160° C. in other embodiments depending on various process conditions and/or resist properties. The process time of the PEB process is in a range from about 60 sec to about 180 sec in some embodiments, depending on various process conditions and/or resist properties. In some embodiments, a post baking process is performed after the development of the exposed photo resist layer.

The developed photo resist pattern 35 includes line patterns extending in the Y direction (perpendicular to the paper plane) in some embodiments. In other embodiments, the developed photo resist pattern 35 includes space (opening) patterns extending in the Y direction. As set forth above, the as developed photo resist pattern 35 has relatively large edge roughness as shown in FIG. 2A. In some embodiments, the roughness of the side faces (3σ value of line widths) of the as-developed photo resist pattern 35 is in a range from about 3 nm to about 5 nm.

After the directional etching operation 200, the roughness of the side faces of the photo resist pattern 35 is reduced similar to FIG. 2C. In some embodiments, the roughness of the side faces (3σ value of line widths) after the directional etching operation 200 is in a range from about 0.1 nm to about 3 nm. In some embodiments, the side faces of the developed photo resist pattern 35 also have roughness in the vertical direction. The directional etching operation may also reduce the vertical roughness in some embodiments.

Then, as shown in FIG. 5D, at S404 of FIG. 4, one or more directional etching operations are performed to trim or smooth the side faces of the developed photo resist pattern 35. In some embodiments, during one or more directional etching operations, a ratio of an amount of etching in the X direction to an amount of etching in the Y direction is changed to adjust the line width in the X direction of the patterns extending in the Y direction.

Subsequently, as shown in FIG. 5E, at S405 of FIG. 4, the underlying layer 20 is patterned by one or more etching operations (e.g., dry etching) using the developed photo resist layer as an etching mask, to obtain patterns 25. Further, the photo resist layer 35 is removed by an ashing and/or wet cleaning operation at S406 of FIG. 4, as shown in FIG. 5F. The patterns 25 are further used to form fin structures, gate patterns or wiring patterns of FinFETs or GAAFETs in some embodiments.

In some embodiments, before or after the directional etching operation, one or more additional lithography and etching operations are performed. In certain embodiments, one or more additional lithography and etching operations to cut the line patterns extending in the Y direction into multiple pieces of line patterns are performed.

Figure 6:
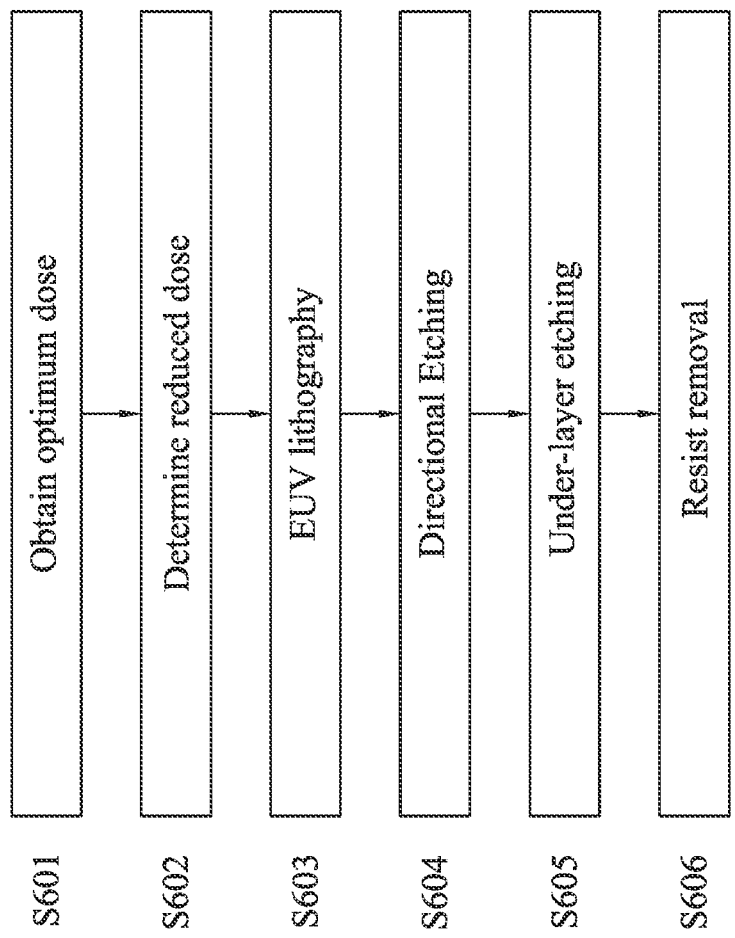
FIG. 6 illustrates a flow chart of a sequential operation of a pattern formation method according to an embodiment of the present disclosure.

FIG. 6 illustrates a flow chart of a sequential operation of a pattern formation method according to another embodiment of the present disclosure. It is understood that additional operations can be provided before, during, and after the operations of FIG. 6, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-5F may be employed in the following embodiments, and some of the explanations may be omitted.

In this embodiment, a dose amount of the EUV exposure is reduced from the optimum dose amount.

At S601 of FIG. 6, an optimum dose is obtained using a photo mask. The optimum dose is determined to obtain a desired pattern (e.g., a minimum pattern in the photo mask) over the underlying layer as shown in FIGS. 5A-5F in some embodiments. In some embodiments, a normal EUV photo resist is used. In some embodiments, a normal EUV photo resist requires a standard dose amount in a range from about 55 $mJ/cm^2$ to 100 $mJ/cm^2$. In other embodiments, the high sensitivity EUV photo resist as set forth is used. Then, at S602 of FIG. 6, a reduced dose amount smaller than the optimum dose amount is determined. In some embodiments, the reduced dose amount is about 60% to 99% of the optimum dose amount. In other embodiments, the reduced dose amount is about 80% to 90% of the optimum dose amount.

At S603 of FIG. 6, the photo resist layer is exposed with the reduce dose amount smaller than the optimum dose amount. In some embodiments, a temperature and/or a process time of the PEB process are increased. In some embodiments, the temperature of the PEB process is about 10° C. to 20° C. higher than the PEB process temperature for determining the optimum dose amount. In some embodiments, the process time of the PEB process is about 30 sec to about 60 sec longer than the PEB process time for determining the optimum dose amount. In other embodiments, a developing time by a developing solution is extended by, for example, about 30 sec to 60 sec longer than the developing process time for determining the optimum dose amount.

The operations S604, S605 and S606 are the same as the operations S405 and S406 as set forth above. In some embodiments, during one or more directional etching operations, a ratio of an amount of etching in the X direction to an amount of etching in the Y direction is changed to adjust the line width in the X direction of the patterns extending in the Y direction.

In some embodiments, test patterns are formed over the underlying layer with the photo mask by varying the exposure dose amount. By measuring the developed pattern, a dose amount that is smaller than the optimum dose amount and that can form acceptable resist patterns is determined as the reduced dose amount. The acceptable resist patterns are the patterns that would result in the desired patterns after the directional etching operation.

Figure 7:
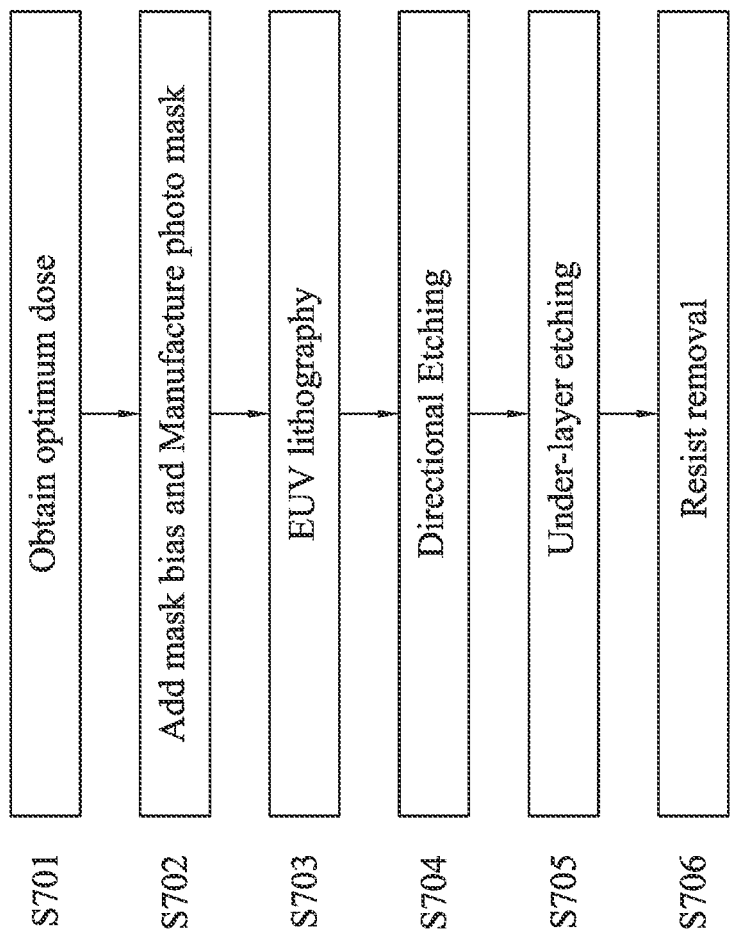
FIG. 7 illustrates a flow chart of a sequential operation of a pattern formation method according to an embodiment of the present disclosure.

FIG. 7 illustrates a flow chart of a sequential operation of a pattern formation method according to another embodiment of the present disclosure. It is understood that additional operations can be provided before, during, and after the operations of FIG. 7, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-6 may be employed in the following embodiments, and some of the explanations may be omitted.

In this embodiment, a mask bias is added during manufacturing a photo mask to reduce a required dose amount. The mask bias is broadening an opaque pattern or narrowing an opaque pattern on the photo mask. In an EUV reflective photo mask, an opaque pattern is a non-reflective pattern.

When an EUV photo resist is a positive photo resist system (exposed portion dissolved by a developing solution), reducing an opaque pattern size (e.g., width) can generally reduce a required dose to obtain a desired pattern. In contrast, when an EUV photo resist is a negative photo resist system (not-exposed portion dissolved by a developing solution), increasing an opaque pattern size can generally reduce a required dose to obtain a desired pattern.

At S701 of FIG. 7, an optimum dose is obtained using a test photo mask without a mask bias in some embodiments. The optimum dose is determined to obtain a desired pattern (e.g., a minimum pattern in the test photo mask) over the underlying layer as shown in FIGS. 5A-5F in some embodiments. In some embodiments, a normal EUV photo resist is used. In some embodiments, a normal EUV photo resist requires a standard dose amount in a range from about 55 mJ/cm$^2$ to 100 mJ/cm$^2$. In other embodiments, the high sensitivity EUV photo resist is used. Then, at S702 of FIG. 7, a mask bias that can reduce the dose amount (a required dose) from the optimum dose amount is determined, and a photo mask with a circuit pattern is manufactured with the mask bias at S703 of FIG. 7.

At S703 of FIG. 7, the photo resist layer is exposed with the reduced dose amount smaller than the optimum dose amount. The operations S704, S705 and S706 are the same as the operations S404, S405 and S406 as set forth above. In some embodiments, during one or more directional etching operations, a ratio of an amount of etching in the X direction to an amount of etching in the Y direction is changed to adjust the line width in the X direction of the patterns extending in the Y direction.

In some embodiments, at S704, a temperature and/or a process time of the PEB process are changed. In some embodiments, the temperature of the PEB process is about 10° C. to 20° C. higher than the PEB process temperature for determining the optimum dose amount without a mask bias. In some embodiments, the process time of the PEB process is about 30 sec to about 60 sec longer than the PEB process time for determining the optimum dose amount without a mask bias. In other embodiments, a developing time by a developing solution is extended by, for example, about 30 sec to 60 sec longer than the developing process time for determining the optimum dose amount without a mask bias.

In some embodiments, the test photo mask includes patterns with different mask biases. Test patterns are formed over the underlying layer with the test mask by varying the exposure dose amount. By measuring the developed pattern, the combination of the mask bias and a dose amount that is smaller than the optimum dose amount is determined. In some embodiments, two or more combinations can be determined.

Figure 8A:
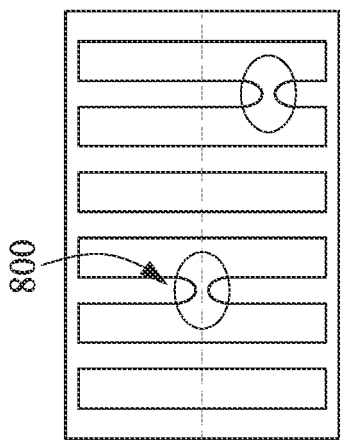
FIGS. 8A, 8B, 8C, 8D, 8E and 8F illustrate a sequential operation of a pattern formation method according to an embodiment of the present disclosure.
Figure 8C:
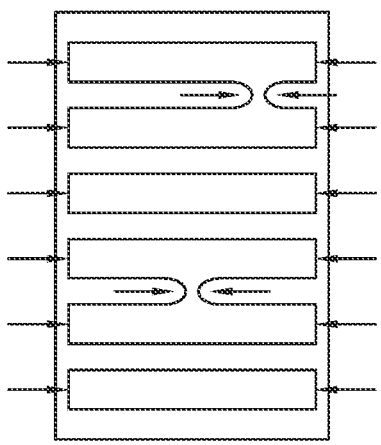
Figure 8E:
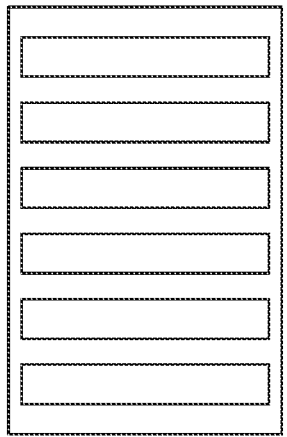
Figure 8B:
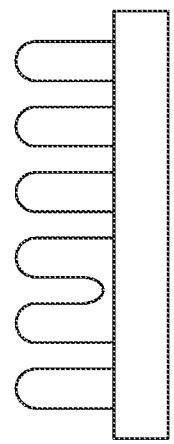
Figure 8D:
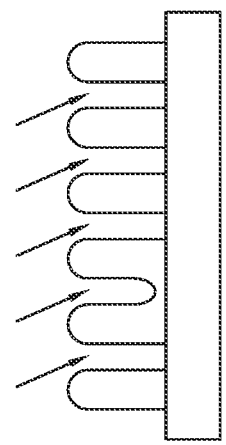
Figure 8F:
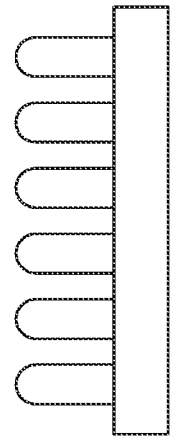

FIGS. 8A-8F illustrate a sequential operation of a pattern formation method according to another embodiment of the present disclosure. It is understood that additional operations can be provided before, during, and after the operations of FIGS. 8A-8F, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-7 may be employed in the following embodiments, and some of the explanations may be omitted. FIGS. 8A, 8C and 8E show plan view (viewed from the above) and FIGS. 8B, 8D and 8F show cross sectional views, respectively.

In some embodiments, after the development process, one or more resist scums or a pattern bridges 800 occur as shown in FIGS. 8A and 8B. The scums and the pattern bridges can be removed by one or more directional etching operations as shown in FIGS. 8C and 8D. After the directional etching operations, a scum or bridge free pattern can be obtained as shown in FIGS. 8E and 8F.

Figure 9:
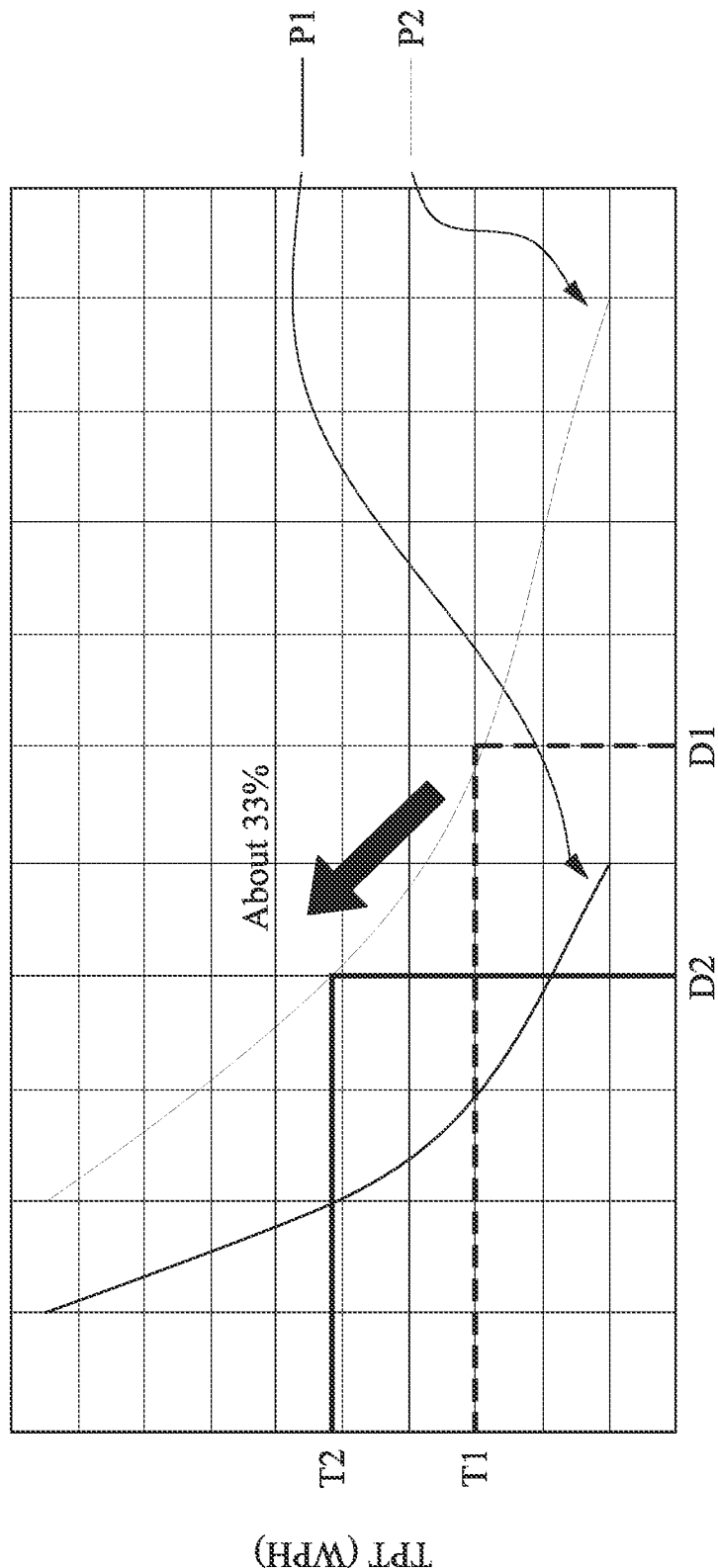
FIG. 9 shows advantageous effects of the pattern formation method according to an embodiment of the present disclosure.

FIG. 9 shows advantageous effects of the pattern formation method according to an embodiment of the present disclosure.

As set forth above, improving productivity (e.g., throughput) of an EUV lithography apparatus is one of the factors to reduce the manufacturing cost of semiconductor devices. FIG. 9 shows relationships between a required EUV exposure dose and a throughput (the number of wafers processed per hour, WPH). FIG. 9 shows two curves for different source powers P1 and P2 (P1<P2). As shown in FIG. 9, when the required exposure dose amount is D1, the throughput is T1. If the required exposure dose amount is D2 (=⅔D1), the throughput is improved from T1 to T2=⅔T1. In some embodiments, D1 is about 60 mJ/cm$^2$ and D2 is about 40 mJ/cm$^2$. As shown in FIG. 9, reducing the required dose amount can improve the productivity of an EUV lithography apparatus. Although a directional etching operation is performed after the EUV lithography operation, the throughput of the directional etching operation is higher than that of the EUV lithography operation in some embodiments. Accordingly, the overall manufacturing cost can be reduced even though an additional operation (directional etching operation) is performed. In other words, the required dose amount in an EUV lithography operation can be reduced to the amount that results in an throughput equal to the throughput of the directional etching operation.

Although a directional etching operation subsequent to an EUV patterning operation is mainly explained in the foregoing embodiments, other lithography operations, such as EUV lithography using ArF or KrF laser light or an electron beam lithography, can be employed.

As set forth above, by using one or more directional patterning operations, it is possible to reduce line width roughness even though a low dose lithography operation is performed, and thus improve the throughput of an lithography operation.

It will be understood that not all advantages have been necessarily discussed herein, no particular advantage is required for all embodiments or examples, and other embodiments or examples may offer different advantages.

In accordance with an aspect of the present disclosure, in a method of forming a pattern, a photo resist layer is formed over an underlying layer, the photo resist layer is exposed to an actinic radiation carrying pattern information, the exposed photo resist layer is developed to form a developed resist pattern, a directional etching operation is applied to the developed resist pattern to form a trimmed resist pattern, and the underlying layer is patterned using the trimmed resist pattern as an etching mask. In one or more of the foregoing and following embodiments, the actinic radiation is an extreme ultra violet (EUV) light. In one or more of the foregoing and following embodiments, a dose amount of the EUV light is in a range from 30 mJ/cm$^2$ to 45 mJ/cm$^2$. In one or more of the foregoing and following embodiments, the developed resist pattern includes a plurality of line patterns extending in a first direction and arranged parallel to each other in a second direction crossing the first direction, and in the directional etching operation, an etching rate of the developed resist pattern along the first direction is greater than an etching rate of the developed resist pattern along the second direction. In one or more of the foregoing and following embodiments, the etching rate of the developed resist pattern along the first direction is twice or more the etching rate of the developed resist pattern along the second direction. In one or more of the foregoing and following embodiments, the etching rate of the developed resist pattern along the first direction is five time or more the etching rate of the developed resist pattern along the second direction. In one or more of the foregoing and following embodiments, after the directional etching operation, line edge roughness of edged along the first direction of the plurality of line patterns is reduced. In one or more of the foregoing and following embodiments, one or more pattern bridge defects occur in the developed resist pattern, and the one or more pattern bridges defects are removed by the directional etching operation.

In accordance with another aspect of the present disclosure, in a method of manufacturing a semiconductor device, a photo resist layer is formed over an underlying layer disposed over a semiconductor substrate, an optimum dose amount of an actinic radiation carrying pattern information from a photo mask with respect to the photo resist layer and a mask pattern of the photo mask is determined, an exposure dose amount smaller than the optimum dose is determined, the photo resist layer is exposed to the actinic radiation carrying pattern information with the determined exposure dose amount, the exposed photo resist layer is developed to form a developed resist pattern, a directional etching operation is applied to the developed resist pattern to form a trimmed resist pattern, and the underlying layer is patterned using the trimmed resist pattern as an etching mask. In one or more of the foregoing and following embodiments, the actinic radiation is an extreme ultra violet (EUV) light. In one or more of the foregoing and following embodiments, the exposure dose is 10% to 40% smaller than the optimum dose. In one or more of the foregoing and following embodiments, the developed resist pattern includes a plurality of line patterns extending in a first direction and arranged parallel to each other in a second direction crossing the first direction, and in the directional etching operation, an etching rate of the developed resist pattern along the first direction is greater than an etching rate of the developed resist pattern along the second direction. In one or more of the foregoing and following embodiments, the etching rate of the developed resist pattern along the first direction is five time or more the etching rate of the developed resist pattern along the second direction. In one or more of the foregoing and following embodiments, after the directional etching operation, line edge roughness of edges along the first direction of the plurality of line patterns is reduced. In one or more of the foregoing and following embodiments, one or more pattern bridge defects occur in the developed resist pattern, and the one or more pattern bridges defects are removed by the directional etching operation.

In accordance with another aspect of the present disclosure, in a method of manufacturing a semiconductor device, a mask bias amount to an original mask pattern is determined, a photo mask is manufactured using the determined mask bias and the original mask pattern, a photo resist layer is formed over an underlying layer disposed over a semiconductor substrate, the photo resist layer is exposed to an actinic radiation carrying pattern information from the photo mask, the exposed photo resist layer is developed to form a developed resist pattern, a directional etching operation is applied to the developed resist pattern to form a trimmed resist pattern, and the underlying layer is patterned using the trimmed resist pattern as an etching mask. The actinic radiation is an extreme ultra violet (EUV) light, and the mask bias is determined in such a manner that an exposure dose of the actinic radiation decreases. In one or more of the foregoing and following embodiments, the mask bias is determined such that an exposure dose with the mask bias is 10% to 40% smaller than an exposure dose without the mask bias. In one or more of the foregoing and following embodiments, the developed resist pattern includes a plurality of line patterns extending in a first direction and arranged parallel to each other in a second direction crossing the first direction, and in the directional etching operation, an etching rate of the developed resist pattern along the first direction is greater than an etching rate of the developed resist pattern along the second direction. In one or more of the foregoing and following embodiments, the etching rate of the developed resist pattern along the first direction is five time or more the etching rate of the developed resist pattern along the second direction. In one or more of the foregoing and following embodiments, after the directional etching operation, line edge roughness of edges along the first direction of the plurality of line patterns is reduced.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pattern, comprising:
    forming a photo resist layer over an underlying layer disposed over a semiconductor substrate;
    exposing the photo resist layer to an actinic radiation carrying pattern information;

developing the exposed photo resist layer to form a developed resist pattern;

applying a directional etching operation to the developed resist pattern to form a trimmed resist pattern; and patterning the underlying layer using the trimmed resist pattern as an etching mask, wherein:

the actinic radiation is an extreme ultra violet (EUV) light, a dose amount of the EUV light is in a range from 40 mJ/cm$^2$ to 55 mJ/cm$^2$, the developed resist pattern includes a plurality of parallel lines extending in a first direction and separated in a second direction perpendicular to the first direction, a line edge roughness of the developed resist pattern before the directional etching operation ranges 3 nm to 5 nm as 3σ value of line widths, and a line edge roughness of the developed resist pattern after the directional etching operation ranges 0.1 nm to 3 nm as 3σ value of line widths.

2. The method of claim 1, wherein the dose amount of the EUV light is in a range from 40 mJ/cm$^2$ to 45 mJ/cm$^2$.

3. The method of claim 1, wherein in the directional etching operation, an etching rate of the developed resist pattern along the first direction is greater than an etching rate of the developed resist pattern along the second direction.

4. The method of claim 3, wherein in the directional etching operation, a ratio of an amount of etching in the second direction to an amount of etching in a vertical direction is 2 or more and 50 or less.

5. The method of claim 3, wherein the etching rate of the developed resist pattern along the first direction is twice or more the etching rate of the developed resist pattern along the second direction.

6. The method of claim 3, wherein the etching rate of the developed resist pattern along the first direction is five times or more the etching rate of the developed resist pattern along the second direction.

7. The method of claim 1, wherein:

one or more pattern bridge defects are formed between a first line and a second line among the plurality of parallel lines, and have a width decreasing from the first line, taking minimum and then increasing to the second line along the second direction in plan view.

8. The method of claim 7, wherein the one or more pattern bridge defects are removed by the directional etching operation.

9. A method of manufacturing a semiconductor device, comprising:

forming a photo resist layer over an underlying layer disposed over a semiconductor substrate;

determining an optimum dose amount of extreme ultra violet (EUV) light carrying pattern information from a photo mask with respect to the photo resist layer and a mask pattern of the photo mask;

determining an exposure dose amount smaller than the optimum dose amount;

exposing the photo resist layer to the EUV light carrying pattern information with the determined exposure dose amount, wherein the exposure dose amount of the EUV light is in a range from 40 mJ/cm$^2$ to 55 mJ/cm$^2$;

developing the exposed photo resist layer to form a developed resist pattern;

applying a directional etching operation to the developed resist pattern to form a trimmed resist pattern; and patterning the underlying layer using the trimmed resist pattern as an etching mask, wherein:

the developed resist pattern includes a plurality of parallel lines extending in a first direction and separated in a second direction perpendicular to the first direction, the exposure dose amount is 10% to 40% smaller than the optimum dose amount, one or more pattern bridge defects occur in the developed resist pattern, a line edge roughness of the developed resist pattern before the directional etching operation ranges 3 nm to 5 nm as 3σ value of line widths, and a line edge roughness of the developed resist pattern after the directional etching operation ranges 0.1 nm to 3 nm as 3σ value of line widths.

10. The method of claim 9, wherein:

the developed resist pattern includes a plurality of line patterns extending in a first direction and arranged parallel to each other in a second direction crossing the first direction, and in the directional etching operation, an etching rate of the developed resist pattern along the first direction is greater than an etching rate of the developed resist pattern along the second direction.

11. The method of claim 10, wherein the etching rate of the developed resist pattern along the first direction is five times to 50 times the etching rate of the developed resist pattern along the second direction.

12. The method of claim 10, wherein:

in the directional etching operation, a ratio of an amount of etching in the second direction to an amount of etching in a vertical direction is 10 to 100.

13. The method of claim 10, wherein at least one of one or more pattern bridge defects is formed between a first line and a second line among the plurality of parallel lines, and has a width decreasing from the first line, taking minimum and then increasing to the second line along the second direction in plan view.

14. The method of claim 9, wherein the exposure dose amount of the EUV light is in a range from 40 mJ/cm$^2$ to 45 mJ/cm$^2$.

15. A method of manufacturing a semiconductor device, comprising:

determining a mask bias for an original mask pattern, wherein the mask bias is determined such that an exposure dose with the mask bias is 10% to 40% smaller than an exposure dose without the mask bias;

manufacturing a photo mask using the determined mask bias and the original mask pattern;

forming a photo resist layer over an underlying layer disposed over a semiconductor substrate;

exposing the photo resist layer to extreme ultra violet (EUV) light carrying pattern information from the photo mask with the exposure dose with the mask bias, wherein the exposure dose of the EUV light is in a range from 40 mJ/cm$^2$ to 55 mJ/cm$^2$;

developing the exposed photo resist layer to form a developed resist pattern;

applying a directional etching operation to the developed resist pattern to form a trimmed resist pattern where one or more resist bridges have been removed; and patterning the underlying layer using the trimmed resist pattern as an etching mask, wherein:

a line edge roughness of the developed resist pattern before the directional etching operation ranges 3 nm to 5 nm as 3σ value of line widths, and a line edge roughness of the developed resist pattern after the directional etching operation ranges 0.1 nm to 3 nm as 3σ value of line widths.

16. The method of claim 15, wherein the developed resist pattern includes a plurality of line patterns extending in a first direction and arranged parallel to each other in a second direction crossing the first direction.

17. The method of claim 16, wherein in the directional etching operation, an etching rate of the developed resist pattern along the first direction is greater than an etching rate of the developed resist pattern along the second direction.

18. The method of claim 17, wherein the etching rate of the developed resist pattern along the first direction is five times or more an etching rate of the developed resist pattern along the second direction.

19. The method of claim 17, wherein the etching rate of the developed resist pattern along the first direction is five times to 50 times the etching rate of the developed resist pattern along the second direction.

20. The method of claim 15, wherein the exposure dose of the EUV light is in a range from 40 mJ/cm$^2$ to 45 mJ/cm$^2$.

* * * * *